United States Patent

Weekamp et al.

Patent Number: 5,935,294
Date of Patent: Aug. 10, 1999

[54] METHOD OF MANUFACTURING AND TRANSFERRING METALLIC DROPLETS

[75] Inventors: Johannus W. Weekamp; Gerardus J. C. Van Gastel; Jozef J. C. Buelens; Willem Hoving, all of Eindhoven, Netherlands

[73] Assignee: U.S. Philips Corporation, New York, N.Y.

[21] Appl. No.: 08/900,276

[22] Filed: Jul. 25, 1997

[30] Foreign Application Priority Data

Jul. 26, 1996 [EP] European Pat. Off. ............... 96202125

[51] Int. Cl.⁶ ........................................................ B22F 9/08
[52] U.S. Cl. ................................. 75/336; 75/345; 164/46; 219/121.66
[58] Field of Search ................. 75/336, 345; 219/121.66; 164/46

[56] References Cited

U.S. PATENT DOCUMENTS

| | | | |
|---|---|---|---|
| 4,472,513 | 9/1984 | Menger-Hammond et al. | 75/345 |
| 5,266,098 | 11/1993 | Chun et al. | 75/335 |
| 5,354,414 | 10/1994 | Feygin | 219/121.66 |
| 5,366,140 | 11/1994 | Koskenmaki et al. | |
| 5,486,427 | 1/1996 | Koskenmaki et al. | |
| 5,614,114 | 3/1997 | Owen | 219/121.66 |

FOREIGN PATENT DOCUMENTS

| | | |
|---|---|---|
| 62-173073 | 7/1987 | Japan. |
| 96-25837 | 8/1996 | WIPO. |

*Primary Examiner*—George Wyszomierski
*Attorney, Agent, or Firm*—F. Brice Faller

[57] ABSTRACT

A method of manufacturing metallic droplets (9), comprising the following steps:

(a) providing a substrate (1) which is substantially transparent to radiation of wavelength λ, one face (1a) of the substrate (1) being provided with a metallic layer (3) which is partitioned into an array of lands (5);

(b) directing a laser beam (7) of wavelength λ through the substrate (1) onto a land (5), thereby causing rapid melting of the land (5) and its detachment from the substrate (1) in the form of a molten droplet (9). In a preferential embodiment of the method, the molten droplet (9) is "shot" onto a target substrate (21) before solidifying.

13 Claims, 3 Drawing Sheets

METHOD OF MANUFACTURING AND TRANSFERRING METALLIC DROPLETS

The invention relates to a method of manufacturing metallic droplets.

BACKGROUND OF THE INVENTION

Such a method is known from U.S. Pat. Nos. 5,366,140 and 5,486,427, in which a substrate is provided with a metal layer which is partitioned into metal regions, and is subsequently heated in an oven to a temperature sufficient to melt the metal and permit beading of the layer into discrete metal droplets. When subsequently allowed to cool, the resulting metal microbeads (solidified droplets) are removed from the substrate by scraping or brushing, so that they can be collected in a container for later use. The micro-beads typically have a diameter of the order of 1 to 50 µm.

An important possible use for such microbeads is, for example, in the creation of connector bumps on integrated circuits and miniature surface-mountable electrical components. However, a considerable problem with such applications is the accurate positioning of individual microbeads on the extremities of such tiny components, and the subsequent fixation of the positioned microbeads to the target area (e.g. using a holding-melting-cooling procedure). In practice, this task is either tediously time-consuming, and thus costly, or has such a high fall-out percentage as to make it commercially unattractive.

A considerable disadvantage of the known method is the fact that it contains relatively many process steps (substrate manufacture, heating in oven, cooling, mechanical removal and collection of microbeads, placement of microbeads in final application). In addition, abrasive removal of the microbeads from the substrate (by scraping or brushing) can be tedious, and can easily damage the microbeads, especially when they are comprised of a soft metal (such as a Pb-Sn alloy, for example).

SUMMARY OF THE INVENTION

It is an object of the invention to provide an alternative method of manufacturing metallic droplets. In particular, it is an object of the invention that such a method should allow the series production of individual metallic droplets, rather then just the simultaneous production of a whole array of droplets en masse. Furthermore, it is an object of the invention that the new method should comprise fewer process steps than the known method. In addition, it is an object of the invention that, in the said method, release of the droplets from their carrying substrate should not entail the use of abrasive means. Moreover, it is an object of the invention that the novel method should be compatible with the accurate placement of individual droplets on well-defined target areas, and their fixation thereto.

These and other objects are achieved according to the invention in a method of manufacturing metallic droplets which comprises the following steps:
(a) providing a substrate which is substantially transparent to radiation of wavelength $\lambda$, one face of the substrate being provided with a metallic layer which is partitioned into an array of lands;
(b) directing a laser beam of wavelength $\lambda$ through the substrate onto a land, thereby causing rapid melting of the land and its detachment from the substrate in the form of a molten droplet.

The method according to the invention is immediately distinguished from the prior art in a number of aspects:

The lands are converted into droplets on a one-by-one basis, instead of en masse, because the lands are individually heated by a laser beam instead of being collectively heated in an oven;

The heating process with the laser is so intense that the droplet formed from a given land becomes forcefully detached from the substrate as a result of rapid vapour formation between the droplet and the substrate. There is therefore no need for abrasive removal of droplets from the substrate;

Since droplet detachment occurs at relatively high velocity (generally of the order of about 0.5 m/s) and in a well-defined direction, it can be exploited to accurately aim ("shoot") individual molten droplets at a predetermined target area. The inventive method therefore makes it possible to efficiently combine the production and placement of metallic droplets.

In the method according to the invention, step (a) can, for example, be performed by electrolessly coating one face of the substrate with a uniform layer of metal, subsequently providing an etch mask on this layer so that the unmasked area assumes the form of a regular "grid", and then etching away this grid so as to leave behind the lands enclosed thereby. Alternatively, and preferentially, a thin, electrolessly-deposited nucleation layer (seed layer) is patterned into lands using the above-mentioned mask-and-etch technique, and these lands are then galvanically thickened. Examples of suitable materials for use in such a nucleation layer include V, Cr and Ti. In yet another alternative, metallic material is sputtered, sprayed or brushed onto a face of the substrate through a mask plate having apertures corresponding to the final lands.

The lands themselves may assume many forms (preferably point-symmetrical), such as discs, squares, triangles, hexagons, etc., the inventors having achieved particularly satisfactory results with octagonal lands. In general, the lands will have a width (diameter) of the order of about 25–150 µm (depending on the desired droplet volume), though the inventive method allows the use of larger or smaller lands; preferentially, the lands will have a width of about 50–100 µm. For purposes of clarity, the term "width" in reference to a land is hereby defined as the diameter of the smallest circle which can encompass the perimeter of the land. In typical applications, the metallic layer (lands) will be about 5–50 µm thick, though, once again, larger or smaller thicknesses are allowed. It should be explicitly noted that not all the lands on the substrate have to have the same shape, size, thickness or composition.

If so desired, the lands may contain a (central) hole, in which case a portion of the laser radiation directed onto such a land will pass through the hole, so as to pre-heat the target area towards which the resulting droplet is to be "shot".

The employed laser may, for example, be selected from the group consisting of Yttrium-Aluminium-Garnet (YAG) lasers [$\lambda \approx 1060$ nm], frequency-doubled YAG lasers [$\lambda \approx 530$ nm], Ar-ion lasers [$\lambda \approx 488$ nm and 514nm] and (frequency-doubled) diode-pumped solid state lasers [e.g. $\lambda \approx 532$ nm]. Such lasers may be either continuous or pulsed, and will preferably be focused into a spot whose width (within the focal plane) is approximately the same as the land being irradiated.

In general, the radiative power $P_i$ of the selected laser should be of the order of about 100 W (assuming a spot-size of the order of 50–100 µm). However, the power ultimately employed will also depend on the irradiation-time $t_i$ of each land. For example, if $t_i$ is of the order of 1 ms, then $P_i$ should be about 50 W, whereas if $t_i$ is of the order of 0.1 ms, then $P_i$ should be about 200 W.

The employed substrate may, for example, comprise glass or quartz, or an organic polymer with a relatively high melting point, such as polycarbonate. Its thickness will generally be of the order of 1 mm, though other thicknesses are also compatible with the inventive method.

The metallic layer may comprise a pure metal (e.g. Au or Cu), or an alloy (e.g. Pb-Sn or Ag-Pt), or a composite layered structure, as desired or required. In the last case, the metallic layer may, for example, comprise an adhesion promoting layer (e.g. Ta), a nucleation layer (e.g. V), a heat-sink layer or absorption layer (e.g. Ni) and a capping layer (e.g. Al-Cu). In a preferential embodiment of the inventive method, the metallic layer comprises a metal selected from the group consisting of Cu, Al, Au, Ag, Pt, Pb, Sn, Mo, W, Ni, and their alloys. These metals are relatively good thermal and electrical conductors, and are widely used in circuit applications (as solder and connector materials).

If so desired, a droplet "shot" from the substrate using the inventive method can be accelerated or decelerated using a gravitational or electrostatic field. In addition, such a droplet can be decelerated by detaching it into a viscous (gaseous) medium.

It should be noted that the radius r of the metallic droplets obtained using the inventive method can be selected in advance by suitable choice of the dimensions of the lands, since the volume of a land will be essentially equal to $4\pi r^3/3$.

Apart from its application in component mounting, e.g. as described in Embodiment 3 herebelow, the method according to the invention has many other important application areas. These include, for example:

Accurate stand-off applications, whereby two surfaces must be fixed with respect to one another at an accurately defined, microscopic separation S. Using the inventive method, a number of metallic droplets (balls) of diameter S can be "shot" onto one of the surfaces. The second surface is then pressed against these balls, and glued, clamped or otherwise fixed in place. This procedure may, for example, be applied in mounting magnetic heads;

Accurate balancing applications. An improperly balanced object (such as a rotating video head or a mini-motor) can be brought into correct balance by shooting one or more droplets onto its surface at particular locations, the weight of such droplets then tending to exert a corrective mechanical moment on the object.

BRIEF DESCRIPTION OF THE DRAWING

Corresponding features in the various Figures are denoted by the same reference symbols.

DETAILED DESCRIPTION OF THE PREFERRED EMBODIMENTS

Embodiment 1

Figure 1:
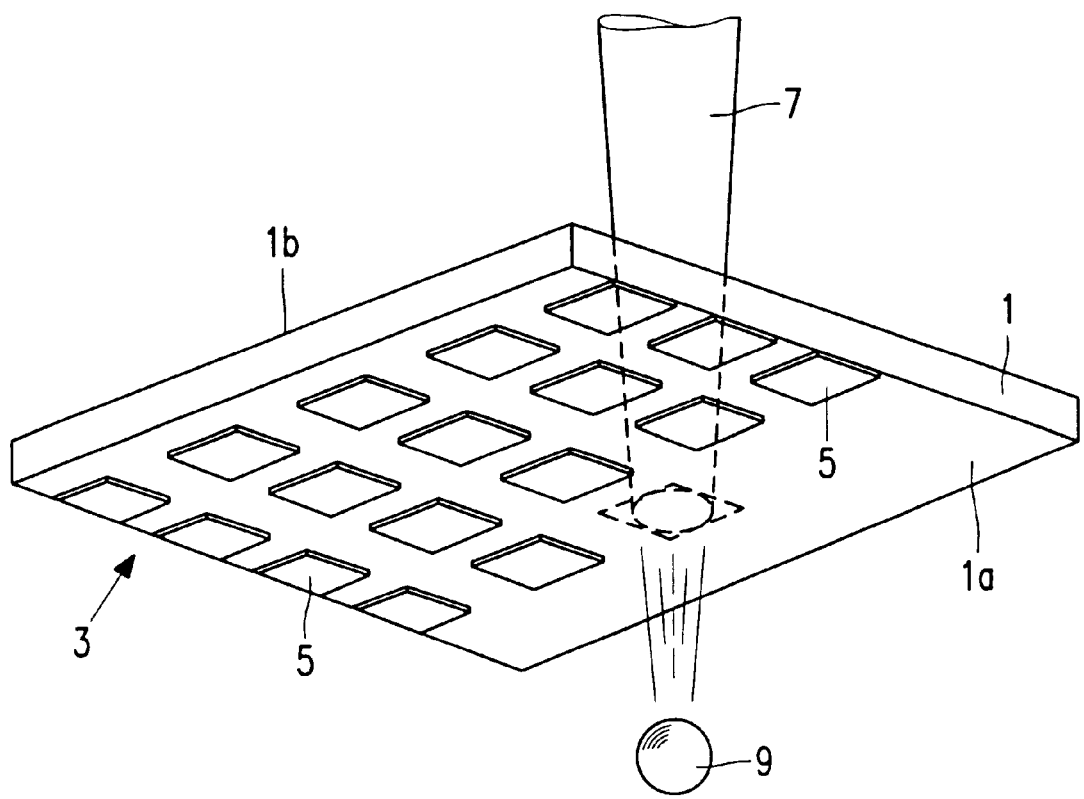
FIG. 1 renders a perspective view of a possible enaction of the method according to the invention.
Figure 2:
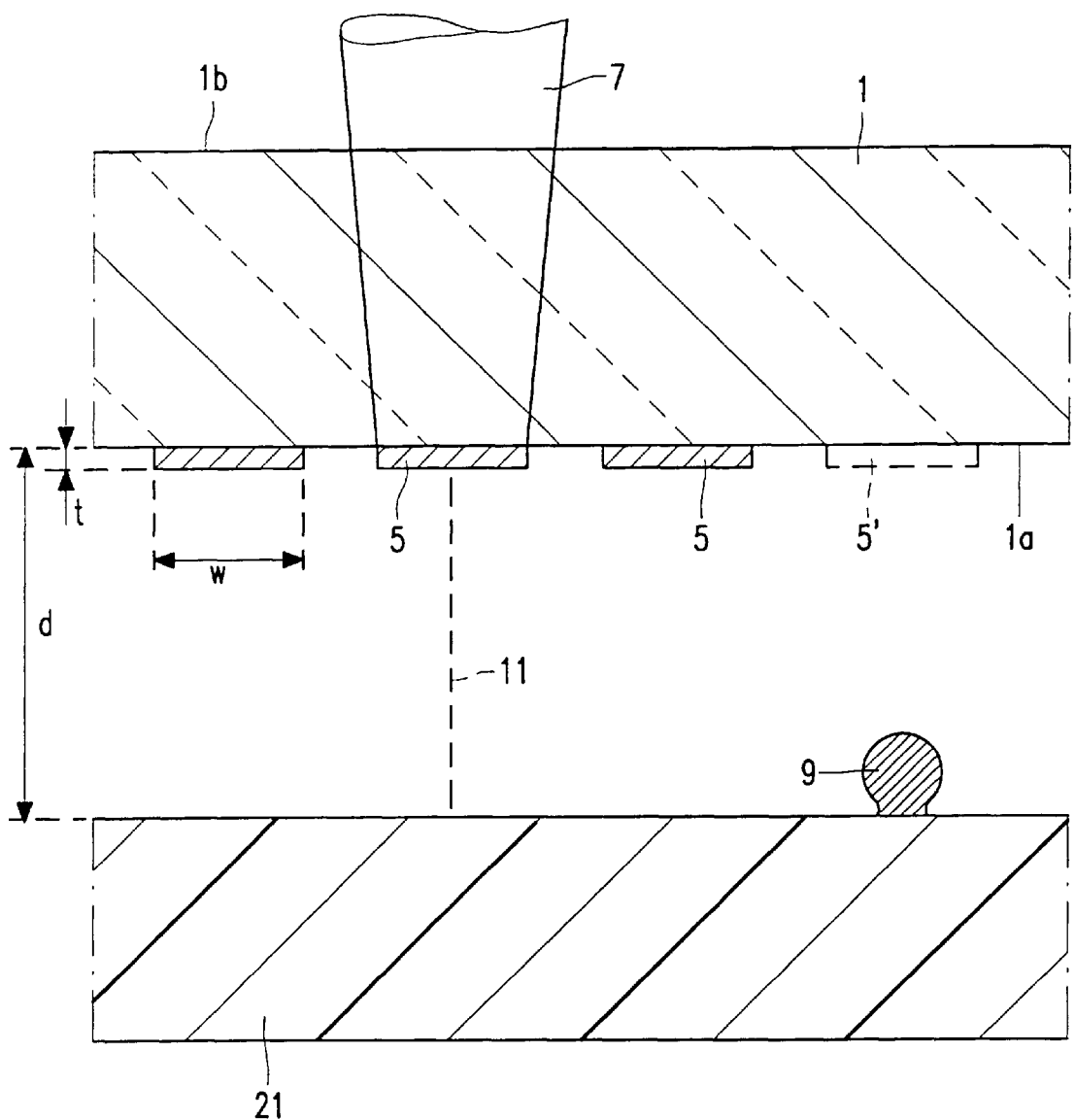
FIG. 2 renders a cross-sectional view of the subject of FIG. 1, with the additional presence of a target substrate in proximity thereto.

FIGS. 1 and 2 depict a possible enaction of the method according to the invention, whereby FIG. 1 gives a perspective view and FIG. 2 gives a cross-sectional view.

A transparent substrate 1 has been provided on one face 1a with a metallic layer 3 which is partitioned into an array of mutually isolated lands 5. As here depicted, the lands 5 take the form of squares, but they may also have a different form, e.g. a circle, triangle or other polygon. In a specific example:

the substrate 1 is comprised of soda glass, and has a thickness of 1 mm;

the lands have a laminated structure, and successively comprise a Ti nucleation layer of thickness 2 $\mu$m and a gold layer of thickness 15 $\mu$m (progressing away from the substrate 1); the total thickness t of the lands is thus 17 $\mu$m. Furthermore, the width w of the lands is 100 $\mu$m, and they are arranged at a mutual separation of 50 $\mu$m.

To create and transfer a metallic droplet 9, a laser beam 7 is focused onto a land 5 via the "rear" side 1b of the substrate. In a particular example, the laser beam 7 is derived from a YAG laser ($\lambda \approx 1060$ nm) with a pulse-length in the range 0.1–1 ms and an energy of the order of 1–10 mJ per pulse. Irradiation of the land 5 in this manner causes a rapid increase in its temperature (generally to a value of the order of about 1000–2000° C.), with attendant (explosive) vapour formation between the land 5 and the face 1a of the substrate 1. As a result of the temperature rise, the land 5 melts, and surface tension effects cause it to assume the form of a droplet (ball) 9. The vapor formation causes this droplet 9 to detach within about 0.2–0.4 ms from the face 1a, with an initial velocity of the order of 0.5–1 m/s. It should be explicitly noted that such detachment occurs regardless of the orientation of the substrate face 1a, i.e. it does not need to be gravity-assisted, for example.

FIG. 2 shows a target substrate 21 which is positioned in proximity to the "carrier" substrate 1, at a distance d from the face 1a. In this particular example, d is of the order of 250 $\mu$m, and the substrate 21 is comprised of $Al_2O_3$ which is coated with a thin film (~1 $\mu$m) of gold (not depicted). The space between the carrier substrate 1 and the target substrate 21 is filled with air at room temperature, though other gaseous media or vacuum are also suitable for such use.

The substrate 21 has already been provided with a droplet 9, which was derived from a land 5' using the inventive method. The diameter of this droplet is approximately 70 $\mu$m. Even though the droplet 9 impinged upon the substrate 21 with a relatively high velocity, it has nevertheless retained a quasi-spherical form. Because the value of d is relatively small, the droplet 9 is still molten upon impact with the target substrate 21, and thus adheres thereto.

It should be noted that the direction of (initial) detachment of a droplet 9 arising from a land 5 will lie along the cylindrical axis 11 of the impinging laser beam 7.

Embodiment 2

In an embodiment otherwise identical to Embodiment 1, the target substrate 21 is replaced by a collection receptacle (not depicted) which is situated at a much greater distance d from the carrier substrate 1 (e.g. d ~5–10 mm). In this case, a droplet 9 which is "shot" off the carrier substrate 1 will have cooled and solidified by the time it reaches the collection receptacle. It is therefore possible in this manner to manufacture and collect individual metallic balls.

Alternatively, returning to Embodiment 1, such balls can be scraped or brushed off of the target substrate 21, and then collected in a receptacle.

Embodiment 3

Figure 3:
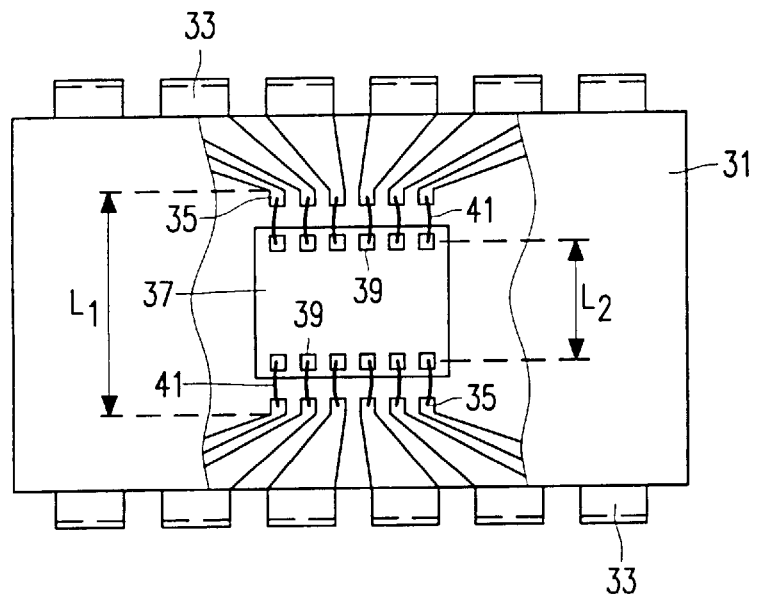
FIG. 3 is a plan view and partial internal view of a housing containing an integrated circuit, the connection between the contact pads of the housing and integrated circuit being made according to the prior art.
Figure 4:
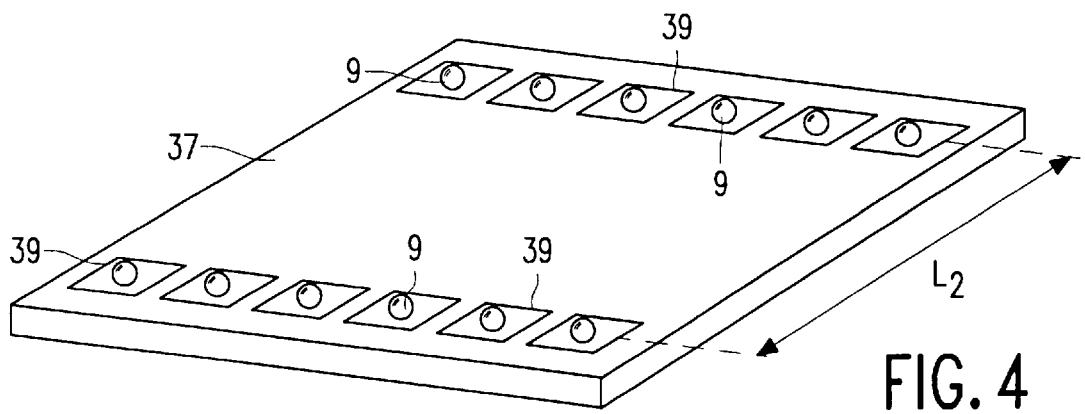
FIG. 4 is a perspective view of an integrated circuit whose contact pads have been provided with metallic balls using the method according to the current invention.
Figure 5:
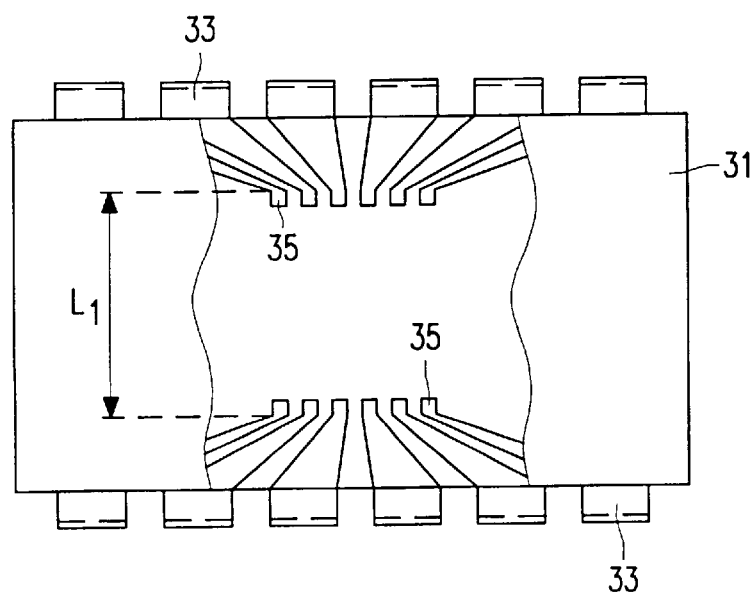
FIG. 5 is a plan view and partial internal view of a housing into which the subject of FIG. 4 can be mounted.

FIGS. 3–5 depict various aspects of the mounting of an integrated circuit 37 in a housing 31. FIG. 3 shows a prior-art mount, whereas FIGS. 4 and 5 relate to a mount which exploits the method according to the current invention.

FIG. 3 renders a plan view and partial internal view of a plastic or ceramic housing 31 (chip package) which is provided along opposite edges with metallic contact terminals 33 (pins). The cut-away internal view shows that the terminals 33 are connected to internal connector tracks which taper towards, and terminate at, an array of contact plates 35. The separation of the arrays at either side of the housing 31 is $L_1$.

An integrated circuit 37 (chip) is located between the arrays 35. This circuit 37 is provided along two opposite sides with an array of contact plates 39, which are connected to various parts of the circuit 37 by conductor tracks (not depicted). The separation of the arrays 39 at either side of the circuit 37 is $L_2$.

In the depicted prior-art mount, the plates 39 have been connected to the plates 35 using fine conductive threads of gold. This requires the use of special precision machinery in a relatively tedious, time-consuming and delicate procedure.

FIGS. 4 and 5 relate to an alternative manner of connecting the plates 39 and 35, whereby use is made of the method according to the invention.

FIG. 4 renders a perspective view of the circuit 37. As here depicted, each of the plates 39 has been provided with a metallic ball (droplet) 9 using the inventive method. To this end, each ball 9 is "shot" onto a plate 39 using a procedure as depicted in FIGS. 1 and 2 (wherein the target substrate 21 should be regarded as the circuit 37).

By ensuring that $L_2 \approx L_1$, and that the mutual separation of the plates 39 is approximately equal to that of the plates 35, the circuit 37 can now be mounted in the empty housing 31 in FIG. 5 using a reflow soldering procedure. To this end, the circuit 37 of FIG. 4 is inverted and placed within the housing 31 of FIG. 5 so that each of the balls 9 rests on a corresponding plate 35. Upon subsequent application of heat (e.g. from an infrared lamp), the balls 9 will melt and adhere to the plates 35. When cooled, these balls then form electrical contacts between the plates 35 and 39.

We claim:

1. A method of manufacturing metallic droplets, characterized in that it comprises the following steps:

(a) providing a substrate which is substantially transparent to radiation of wavelength λ, one face of the substrate being provided with a metallic layer which is partitioned into an array of mutually separated lands;

(b) directing a laser beam of wavelength λ through the substrate onto one of said lands, thereby causing rapid melting of said one of said lands and its detachment from the substrate in entirety in the form of a single molten droplet.

2. A method according to claim 1, characterized in that the metallic layer comprises a metal selected from the group consisting of Cu, Al, Au, Ag, Pt, Pb, Sn, Mo, W, Ni, and their alloys.

3. A method according to claim 1, characterized in that the thickness of the metallic layer lies in the range 5–50 μm, and that the width of each land lies in the range 25–150 μm.

4. A method according to claim 1, characterized in that the laser beam is selected from the group consisting of Yttrium-Aluminium-Garnet lasers, frequency-doubled Yttrium-Aluminium-Garnet lasers, Ar-ion lasers, diode-pumped solid state lasers and frequency-doubled diode-pumped solid state lasers.

5. A method according to claim 1, characterized in that the substrate is comprised of glass or quartz.

6. A method according to any of the claim 1, further comprising the step of catching the detached molten metal droplet on a target substrate before solidifying.

7. A method according to claim 6, characterized in that the target substrate is an electrical contact terminal of an electronic component.

8. The method of claim 1 wherein the lands are polygonal shaped.

9. The method of claim 8 wherein the lands are octagonal shaped.

10. The method of claim 1 wherein the lands each have an opening.

11. The method of claim 10 further including the step of preheating a target substrate by directing at least a portion of the laser beam through the opening in the lands onto a target area of the target substrate.

12. The method of claim 1 wherein the step of directing the laser beam through the substrate is performed by sequentially directing the laser beam onto one land at a time.

13. The method of claim 1 further comprising the step of subjecting the molten droplet to an electrostatic field.

* * * * *